United States Patent
Mains

[19]

[11] Patent Number: 5,771,375
[45] Date of Patent: Jun. 23, 1998

[54] AUTOMATIC DELAY ADJUSTMENT FOR STATIC TIMING ANALYSIS USING CLOCK EDGE IDENTIFICATION AND HALF CYCLE PATHS

[75] Inventor: Robert E. Mains, Austin, Tex.

[73] Assignee: International Business Machines Corporation, Armonk, N.Y.

[21] Appl. No.: 529,382

[22] Filed: Sep. 18, 1995

[51] Int. Cl.6 .......................................... G06F 1/08
[52] U.S. Cl. ............................................. 395/558
[58] Field of Search ..................... 395/558; 364/488–490

[56] References Cited

U.S. PATENT DOCUMENTS

| | | |
|---|---|---|
| 4,443,883 | 4/1984 | Berger . |
| 4,807,109 | 2/1989 | Farrell ..................................... 395/550 |
| 4,851,995 | 7/1989 | Hsu et al. .............................. 395/550 |
| 4,870,562 | 9/1989 | Kimoto et al. ......................... 395/550 |
| 4,949,249 | 8/1990 | Lefsky et al. .......................... 395/550 |
| 5,210,700 | 5/1993 | Tom ....................................... 364/489 |
| 5,210,858 | 5/1993 | Horst ..................................... 395/550 |
| 5,222,230 | 6/1993 | Gill et al. ............................... 395/550 |
| 5,274,796 | 12/1993 | Conner ................................. 395/550 |
| 5,297,276 | 3/1994 | Millar et al. ........................... 395/550 |
| 5,303,365 | 4/1994 | Getzlaff et al. ........................ 395/550 |
| 5,305,451 | 4/1994 | Chao et al. ............................ 395/550 |
| 5,347,559 | 9/1994 | Hawkins et al. . |
| 5,388,249 | 2/1995 | Hotta et al. ............................ 395/550 |
| 5,544,071 | 8/1996 | Keren et al. ........................... 364/489 |
| 5,579,510 | 11/1996 | Wang et al. ........................ 364/489 X |

*Primary Examiner*—Thomas M. Heckler
*Attorney, Agent, or Firm*—Anthony V.S. England; Andrew J. Dillon

[57] ABSTRACT

An apparatus and method are disclosed that perform static timing analysis on a logic circuit. The logic circuit is unique in that it includes a path topology having a mixture of full cycle and half cycle timing paths. The apparatus and method first perform a data event identification event on the logic circuit and use this event to define a set of clock-to-data-phase transformation rules for defining in all latch instances of the circuit, how each data phase is generated and from what clock edge each data phase is created. Next, the system then performs a test edge selection and then performs a clock adjustment based on the transformation rules and the test edge selection. In performing the test edge selection, the system selects a correct time leading or time trailing edge based on which edge level of the clock is the level against which an arriving data signal to be tested. The clock adjustment is further performed by examining a test edge associated with the data phase associated with the arriving data signal to be tested, selecting a full cycle adjustment, which is the same as the edge launched by the data signal, and then performing a half cycle adjustment if the test edge is opposite the edge launched by the data signal.

22 Claims, 3 Drawing Sheets

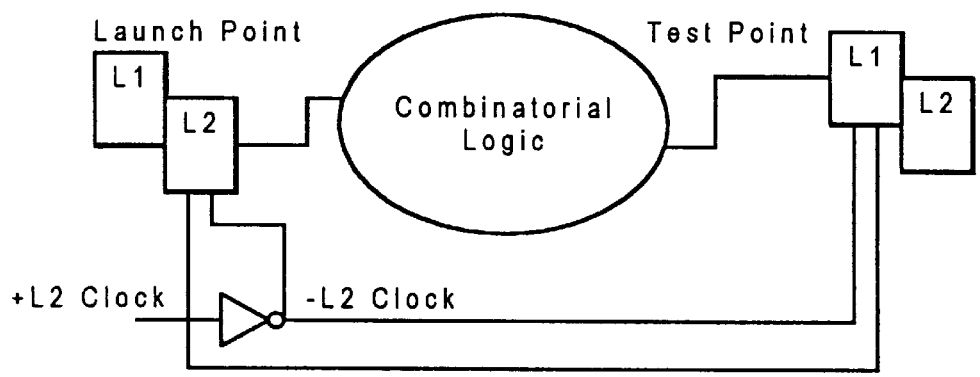
Fig. 1
*Prior Art*
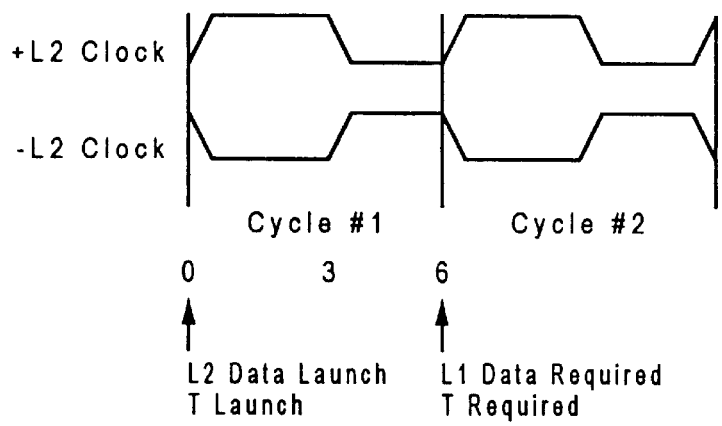
Fig. 2
*Prior Art*
| Phase Name | T Leading | T Trailing | Cycle Time |
|---|---|---|---|
| +L2 | 0 | 3 | 6 |
| -L2 | 0 | 3 | 6 |
| L2R | 0 | 3 | 6 |
| L2F | 0 | 3 | 6 |
Fig. 3

AUTOMATIC DELAY ADJUSTMENT FOR STATIC TIMING ANALYSIS USING CLOCK EDGE IDENTIFICATION AND HALF CYCLE PATHS

BACKGROUND OF THE INVENTION

1. Technical Field

The present invention relates, in general, to the field of logic timing analysis and, more particularly, to conducting logic circuit timing analysis by adjusting a path delayed to account for the effect of phase differences between clock signals that drive data signals on the path. More particularly still, the present invention is related to the field of logic timing analysis using discrete sequential element clock edge identification and half cycle paths for performing static timing analysis.

2. Background of the Prior Art

In static timing analysis, the logic design of a circuit is analyzed to identify timing problems in the design. The logic design is analyzed by propagating cumulative path delays from the inputs of the circuit to its outputs in a single pass. A timing problem arises at a point in the circuit that joins two circuit paths when the signal on one of the paths arrives at the point with an improper timing relationship to the signal along the second path.

Static timing analysis, therefore, concerns a point by point analysis of a logic circuit in which all possible paths to the current point are analyzed to detect timing problems. This is contrasted with dynamic timing analysis in which logic circuit operation is simulated.

Static timing analysis proceeds by propagating maximum delays from the inputs to the outputs of a design in a single pass through the design. Assuming that the design includes clocked elements such as latches, the single pass analysis means that such elements would be clocked only once during the analysis. If data is generated at the output pin of the clocked element (the "source" element) later than it is expected to be clocked into the input pin of the next downstream clocked element (the "sink" or "close" element) the data will appear to be too late from the standpoint of the sink latch. This anomaly is resolved by making a timing adjust to the delay value that is propagated out of the output pin of the source latch. The timing adjustment is made by subtracting a clock cycle from the delay value so that the data will appear to have been clocked out of the output pin during the clock cycle preceding that during which it is clocked into the downstream input pin.

One solution in the field of static timing analysis has led to the identification and association of sequentially generated data signals with the clock signal that was responsible for launching the data signal. This method is know as automatic delay adjustment for static analysis (DTA) algorithm or phase tag algorithm. Unfortunately, this solution does not sufficiently address the design practice of using a 50% duty cycle clock to generate both an "in-phase" and "out-of-phase" clock pair for the clocking of discrete L1/L2 latch elements, and for the handling of full cycle and half cycle timing paths. For example, FIG. 1 shows a typical logic clocking scenario in a high performance digital processing unit where a master clock is brought on chip and split into two corresponding clock signals. The prior method only defines events based on the rising edge of a clock. Thus, in FIG. 1, the L2 device is launched by the rising edge of the +L2 clock (falling edge of –L2), while the L1 launches with the rising edge of –L2 (falling edge of +L2). The prior method maps the clock phase of both the –L2 and the +L2 to a common data phase (L2R), which does not provide enough information to allow distinguishment between signals originating from L1 or L2 type devices, or determining if the data signal was caused by a rising or falling edge of a clock. For the PowerPC family of microprocessors, events occur on both the rising and falling edges of the defined clock. Hence, the existing solution fails to define fully the origination of data events occurring on both the rising and falling edges of a single clock.

Accordingly, what is needed is a static timing analysis solution that is able to provide discrete sequential clock edge identification and half cycle paths in a microprocessor that issues events on both the rising and falling edges of defined clock signals.

SUMMARY OF THE INVENTION

It is therefore one object of the present invention to provide an improvement in the field of logic timing analysis.

It is another object of the present invention to provide an improvement to conducting logic circuit timing analysis by adjusting a path delay to account for the effect of phase differences between clock signals that drive data signals on the path.

It is yet another object of the present invention to provide an improvement in the field of logic timing analysis using discrete sequential element clock edge identification and half cycle paths for performing static timing analysis.

The foregoing objects are achieved as is now described. According to the present invention, an apparatus and method are disclosed that perform static timing analysis on a logic circuit. The logic circuit is unique in that it includes a path topology having a mixture of full cycle and half cycle timing paths. The apparatus and method first perform a data event identification event on the logic circuit and use this event to define a set of clock-to-data-phase transformation rules for defining in all latch instances of the circuit, how each data phase is generated and from what clock edge each data phase is created. Next, the system then performs a test edge selection and then performs a clock adjustment based on the transformation rules and the test edge selection. In performing the test edge selection, the system selects a leading or trailing timing edge based on which edge level of the clock is the level against which an arriving data signal is to be tested. The clock adjustment is further performed by examining a test edge associated with the data phase associated with the arriving data signal to be tested, selecting a full cycle adjustment, if the test edge is the same as the edge launched by the data signal, or performing a half cycle adjustment if the test edge is opposite the edge launched by the data signal. The data identification event is based upon a first data event initiated by a rising edge of the clock and a second data event initiated by the falling edge of the clock. From this identification event, there is established a clock phase used in defining how each data phase is generated and from what clock edge each data phase is created. The clock-to-data-phase transformation rules are defined based upon the clock edge trigger sensitivity for each latching device within the circuit and the phase of the clock. Each latching device is sensitized by either a rising or falling clock edge, based upon the particular circuitry used.

In an alternative embodiment, the system conducts static timing analysis of a logic design. The logic design includes a multi-phase logic clock, circuit logic elements, and connections between the circuit logic elements. The circuit logic elements further include clocked elements that are triggered by the multi-phase clock. The system first stores periodic timing information for the multi-phase logic clock and from this periodic information performs a test edge selection. Using the periodic timing information, the system then performs a clock adjustment, which adjustment is based upon the following. First, the system defines all ideal activity periods for the multi-phase clock. Next, the system associates a tag for each data signal launched from a clocked storage element. This tag contains the name of the multi-phase clock and a clocked edge level for explicitly defining the data signal origination. Then, the system examines the phase of a capturing clock and clock edge level against which the data arrival time is to be compared and whether the clock required time is greater than the ideal data arrival time. Based upon this examination, the system then performs the clock adjustment depending upon the comparison. For example, if the clock required time is not greater than the ideal data arrival time, the system then increases the ideal clock requiring time by multiples of the clock cycle until the clock required time is greater than the ideal data arriving time. Otherwise, if the clock required time is greater than the ideal data arrival time, then no clock adjustment is required.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a prior art schematic diagram of a pair of launch point and test point latches interconnected by a combinatorial logic;

FIG. 2 depicts in accordance with a preferred embodiment of the present invention clock signals shown in the clock cycle;

FIG. 3 depicts a phase table defining an −L2 or +L2 defined clock;

DETAILED DESCRIPTION OF THE PREFERRED EMBODIMENT

To understand fully the significance of being able to distinguish which clock edge is active, a comparison is made to the circuit of FIG. 1. FIG. 1 is a prior art schematic diagram of a pair of launch point and test point latches (L1,L2), interconnected by a combinatorial logic as driven by a first, +L2 and second, −L2, clock signals is further shown in the clock cycle of FIG. 2. A phase table defining an −L2 or +L2 defined clock is further shown in FIG. 3. Distinguishing which clock edge initiated a data event is crucial for properly determining, at a downstream test point, in which clock cycle the arriving data signal should be compared to the requiring clock. The prior art solution assumes all data signals are derived from the rising clock edge, and at all test points, the test of the arriving data is made against the rising edge of the clock. This solution fails to analyze half cycle logic paths properly.

Figure 4:
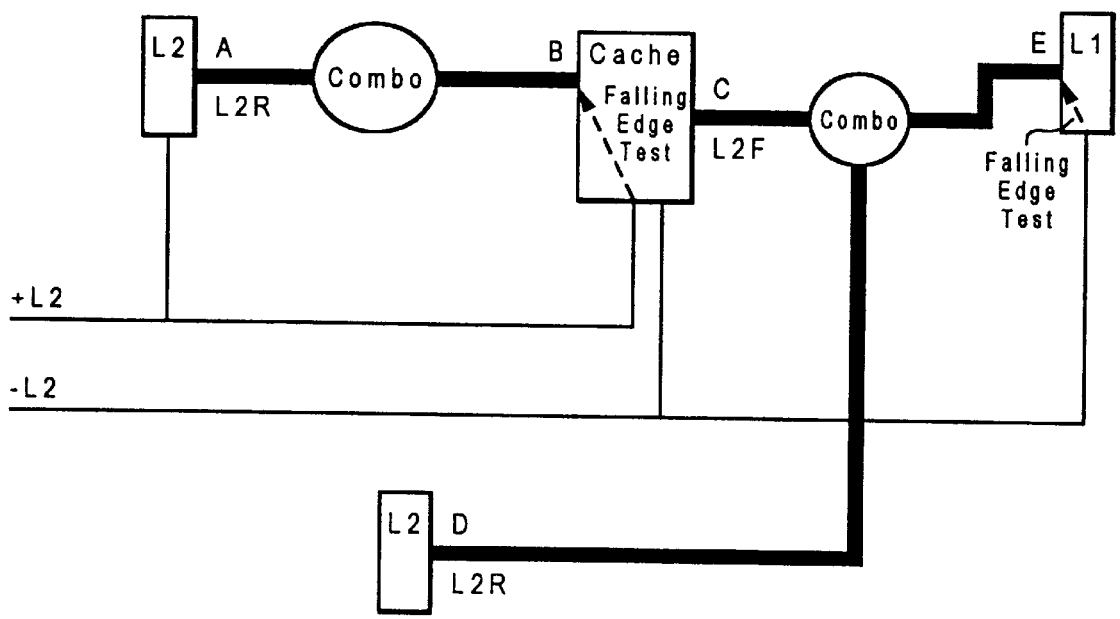
FIG. 4 is a schematic block diagram of a circuit according to the present invention that uses a mix of full cycle and half cycle paths.
Figure 5:
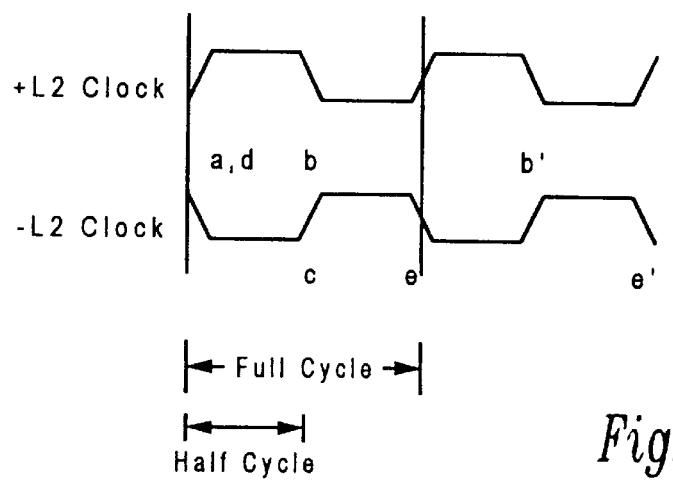
FIG. 5 depicts a timing diagram of the circuit in FIG. 4.

FIG. 4 is a schematic block diagram of a circuit according to the present invention that uses a mix of full cycle and half cycle paths using the same clock and phase definitions found in FIG. 1. A timing diagram of the circuit in FIG. 4 is shown in FIG. 5. Significantly, the test point at E has both full cycle and half cycle data signals arriving for comparison to the −L2 clock signal. A full cycle timing path exists from point D to E, with a launch time of d and requiring time of e as shown in FIG. 5. A half cycle path, as shown in FIG. 5, is characterized by two data elements clocked by common clock and separated by the combinatorial logic. The timing objective of the half cycle path is to propagate data from point A to point B within the timing constraint window a to b.

The prior method performs a one cycle clock adjust at point B, placing the timing constraints at b', one cycle later than the constraint desired by the logic designer. The adjust occurs because the incoming data signal has a reference launch time of zero and the requiring clock (+L2) has a reference capture time of zero. The original formulation stipulates that the reference capture time must be greater than the arriving data signal launch time. Since in this case the two are identical, a one cycle clock adjust is generated placing the required test time at b'. A half cycle path also exists from point C to point E. The half cycle path from C to E launches from C at time c and is required to be at E at one-half clock cycle later at time e, not at e', as would be derived by the original solution as described for the timing of point A to B.

Due to the path topology mixture of full cycle and half cycle timing paths, the original static logic timing analysis previously performed was inadequate in testing in the full cycle and half cycle timing path mixed as found in the PowerPC family of microprocessors, as designed by International Business Machines Corporation. Accordingly, an improved static timing analysis method is disclosed that is able to recognize discrete sequential element clock edge identification and half cycle paths.

Figure 6:
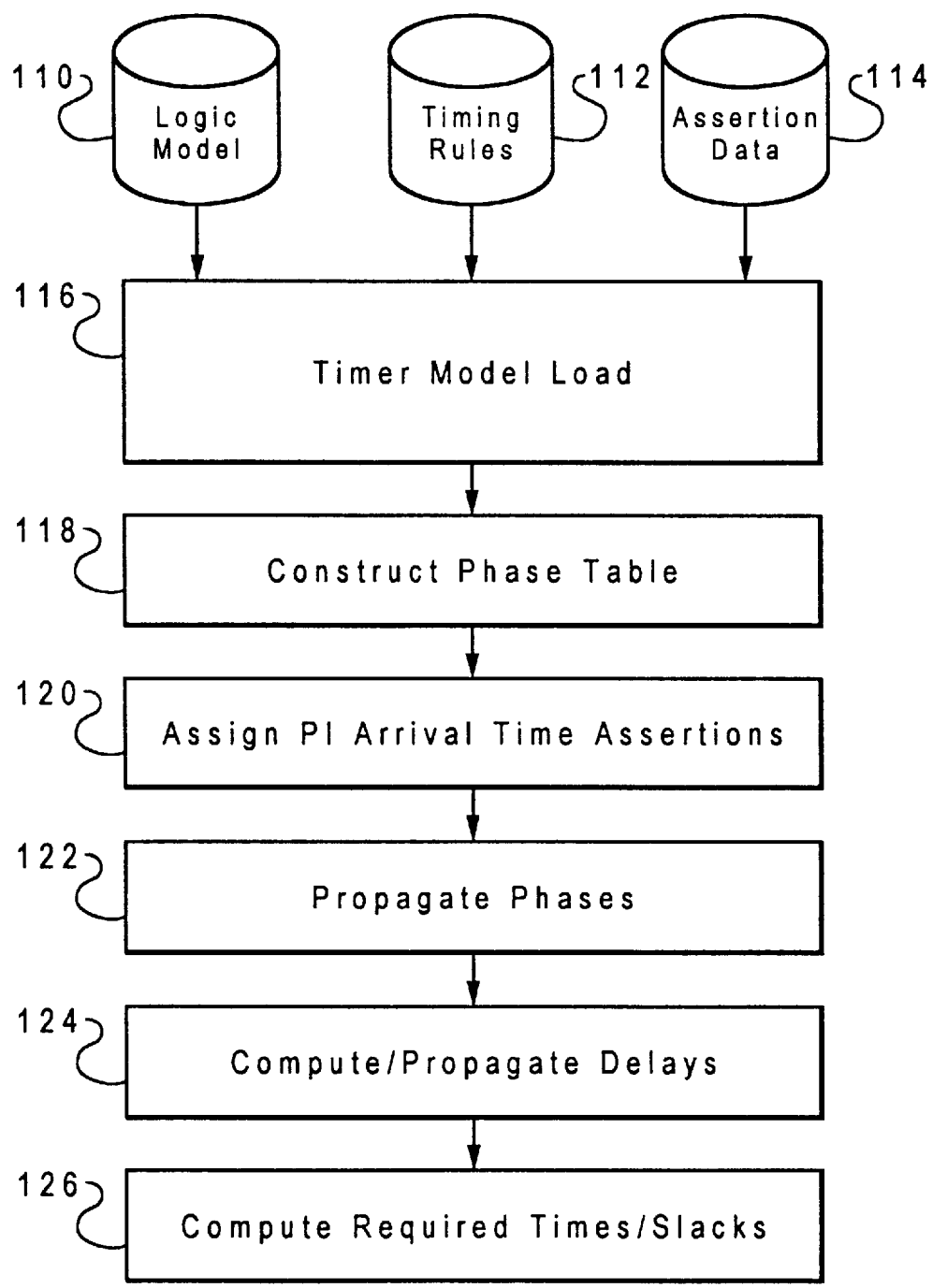
FIG. 6 is a block diagram illustrating the steps of implemented in the performance of the improved static timing analysis method.

FIG. 6 is a block diagram illustrating the steps implemented in the performance of the improved static timing analysis method according to the present invention. Initially, a logic model 110, timing rules 112, and assertion data 114, which comprises the primary input (PI) arrival times and the clock phase definitions for all clocks, are combined to establish a timer model load in block 116. With input from the phase assertion file, the system constructs a phase table in block 118 consistent with the table represented in FIG. 3. Once the phase table has been constructed, the system in block 120 assigns the Pi arrival time (AT) assertions and propagates the phases through the model (block 122) as described below in the transformation of clock phases to data event phases. Afterwards, in block 124 the system then computes delays and propagates arrival times for all points in the circuit starting from the initial time specifications at the primary inputs. This results in all points in the timing model having valid time records with valid phase indices.

In block 126 the system computes required times and slacks. In establishing the selection of the test edge for each data test point, the system extracts the necessary data records for the test from the timing rules 112. For the test point, the system extracts from the timing rule the reference clock pin and reference clock level. Further, the system then obtains from the timing rule the data signal levels to be tested against the reference signal level of the clock. For the reference point and reference signal level, the system extracts from the timing delay record a phase record index. From the phase table, the system extracts the phase time for the reference edge. For the data signal and test level, the system extracts the phase record and index from the timing record. Next from the phase table, the system extracts the phase time for the data edge. Finally, the system determines the amount of time adjust based on the clock cycle adjustment inequalities shown below.

To implement the improved static timing analysis method, the computer system must perform a data event identification event. For each uniquely named clock, which may be called a master, the system stores its periodic timing information, specifically, the ideal time of the leading clock edge, the time of the trailing clock edge, and the cycle time. From the definition of this master clock, the system also stores the inverse of the clock such that a signal called +Clock generates −Clock. The reference edges and periodic information defined for the master are the same for the inverse of the master.

For each uniquely named clock, the system also defines a data event that is initiated by the rising edge of the clock and a separate data event that is initiated by the falling edge of the clock. The name of the data event is of the form:

clock_name R (data signal derived from the rising clock)

clock_name F (data signal derived from falling clock)

A set of clock-to-data-phase transformation rules are defined based upon the clock edge trigger sensitivity of the latching device and the polarity, or phase of the clock. These transforms have the generic form of:

latch_output_data phase=clock_to_data transform (clock_polarity, trigger_sensitivity)

Latching devices can be sensitized by either a rising or falling clock edge, depending on how the elements are designed. The specific transforms that occur at latches that generate rise and fall data events are:

clock_name R=clock_to_data_transform(+clock_name, RISING_TRIGGERED)

clock_name R =clock_to_data_transform(−clock_name, FALLING_TRIGGERED)

clock_name F=clock_to_data_transform(+clock_name, FALLING_TRIGGERED)

clock_name F=clock_to_data_transform(+clock_name, RISING_TRIGGERED)

These transforms define for all latch instances how the data phase will be generated and from what clock edge the data phase is created.

Next, the system performs a test edge selection and clock adjustment. In order to determine accurately the test edge at a test point, and subsequently determine a proper clock adjustment, the system uses the knowledge of what edge, or level, of the clock is the level against which the arriving data signal is to be tested, and the polarity of the clock. This allows selection of the correct TIME_LEADING or TIME_TRAILING value from a phase definition table as shown in FIG. 3. If the arriving data signal is launched by a +L2 clock that yields a data phase of L2R with TIME_LAUNCH=ZERO, and the test latch is clocked by a +L2 clock, the usage of the test edge level specification informs the system that if a clock adjust is necessary for a half cycle or for a full cycle test by properly extracting the correct TIME_REQUIRED value of either Tlead or Ttrail for the requiring clock. If the test edge is the same as the edge that launched the data signal (time_launch=t lead=time_required), the system performs a full cycle clock adjust based upon the inequality relation:

Time_Launch<Time_Required+I*Cycle_Time

Where I varies from zero to small n, TIME_LAUNCH is the ideal launch time for the data, TIME_REQUIRE is the ideal require time, CYCLE_TIME is the cycle time of the requiring clock, and n is defined to be:

n=(maximum(clock_cycle, data_cycle)/minimum(clock_cycle, data_cycle))+1.

If I=1, a one cycle clock adjust is performed.
If the test edge is against the trailing edge of the clock, the system performs no clock adjust since:

TIME_LAUNCH=Tlead=0<TIME_REQUIRED=Ttrail=3

The usage of the clock test edge level allows the system to extract properly the TIME_REQUIRED time from the phase table for comparison to the TIME_LAUNCH time to determine if a clock adjust is necessary at the test point.

The timing diagram in FIG. 5, along with the timing flow of FIG. 4, shows data launch by the +L2 clock, at time a, from A, passing through combinatorial logic to arrive at the cache before the falling edge of the +L2 clock occurs at time b. The L2R data signal informs the system that the launch time of the signal was from the leading clock edge of time TIME_LAUNCH=0. The test specification of the +L2 clock of the cache to the data signal is against the falling edge of the clock. This sets the TIME_REQUIRED at 3. Since the TIME_REQUIRED is greater than the launch time, no adjustment of the clock time is made at the cache and the test is performed at b as desired.

Path D to E is an example of a full cycle path. D again has a TIME_LAUNCH of zero. TIME_REQUIRED value for E is determined by referencing the test specification for the latch that is against the falling edge of the −L2 clock. This edge is identical to the edge at a, except one cycle later. The system then extracts a TIME_REQUIRED of zero from the phase table and calculates I=1 from the above inequality to satisfy the relationship, thereby yielding a clock adjust of one cycle at E.

Once the data event identification event and test edge selection have been performed, the system is ready to implement the method of static timing analysis for full cycle and half cycle topologies. To begin, the system requires the storage of table that defines the ideal active periods of all system clocks existent in the microprocessor chip design. This table contains for each active clock definition the following:

The true definition of the clock with time Tlead and Ttrail, and the clock cycle time.

The logical inverse of the defined active (master) clock with identical Tlead and Ttrail.

The rising edge sensitive phase definition for a data signal launched by the rising edge of the clock.

The falling edge sensitive phase definition for a data signal launched by the falling edge of the clock.

FIG. 3 is a phase table definition for rising and falling edge sensitive data launched paths.

Each data signal launched from a clocked storage element has associated with it a tag that contains the name of clock and the level of the clock edge (designated R(rise) or F(fall)), that explicitly defines the data signal origination. The tags are propagated throughout the logic model along with rise/fall arrival times based upon calculated pin-to-pin delays. Utilizing items of information associated with the tag, the system then extracts from the table the ideal launch time of the data edge.

At the test point, the system then examines the phase of the capturing clock and the clock edge level (rise and fall) against which the data arrival time is to be compared. The clock edge level against which the data arrival time is to be compared against is obtained from a timing rule that defines the operations timing requirements for the device. From this information, the system then extracts either the Tlead or Ttrail value from the table for the requiring clock phase to determine the ideal required time. If the clock requiring time is greater than the ideal data arrival, no adjust is necessary; otherwise, the ideal clock requiring time is increased by multiples of the clock cycle until the requiring time is greater than the ideal arriving time.

This method allows for precise identification of both half and full cycle paths by specifically identifying the launching and requiring clock edges, and using the ideal wave form times associated with these edge definitions to determine accurately if the clock adjustments are required for making half cycle or full cycle timing checks.

While the invention has been particularly shown and described with reference to a preferred embodiment, it will be understood by those skilled in the art that various changes in form and detail may be made therein without departing from the spirit and scope of the invention. For example, the invention may be implemented in computer readable or usable code for loading into and operation on a computer system. Such computer systems are well known in the art. Typically, the computer system has a main processing unit, main memory, long term data store, which may include removable and non-removable media, a network connection, and assorted peripheral devices such as a display, printer, and telecommunications device.

What is claimed is:

1. A method within a data processing system of performing static timing analysis on a logic circuit that includes a path topology mixture of full cycle and half cycle timing paths, wherein said logic circuit operates in conjunction with a clock signal alternating between a first level and a second level each said alternation designated as an edge, comprising:

performing a data event identification event;

defining a set of clock-to-data-phase transformation rules in response to said step of performing a data event identification event for defining how a data phase is generated and from what edge of said clock signal said data phase is created for each of a plurality of latching devices within said logic circuit;

performing a test edge selection; and performing a clock adjustment utilizing said set of clock-to-data-phase transformation rules and said test edge selection.

2. The method according to claim 1 wherein said step of performing a test edge selection comprises:

selecting a test edge of said clock signal responsive to which of a rising edge of said clock signal or a falling edge of said clock signal an arrival time of a data signal is to be tested against.

3. The method according to claim 1 wherein said step of performing a clock adjustment comprises:

examining said selected test edge associated with a data phase associated with an arriving data signal and said set of clock-to-data-phase transformation rules;

deriving a launching edge of said clock signal for said arriving data signal;

performing a full cycle clock adjustment if said selected test edge is the same as said derived launching edge of said clock signal said arriving data signal; and performing no clock adjustment if said selected test edge occurs subsequently to said derived launching edge of said clock signal for said arriving data signal.

4. The method according to claim 1 wherein said step of defining a set of clock-to-data-phase transformation rules comprises:

defining a set of clock-to-data-phase transformation rules utilizing a trigger sensitivity to an edge of said clock signal of each of said plurality of latching devices within said logic circuit and a phase of said clock signal.

5. The method according to claim 1 wherein said step of performing a data event identification event comprises:

defining a first data event initiated by a rising edge of said clock signal; and defining a second data event initiated by a falling edge of said clock signal.

6. The method according to claim 5 wherein said step of performing a data event identification event further comprises:

establishing a phase of said clock signal utilized in said step of defining a set of clock-to-data-phase transformation rules.

7. A method within a data processing system for conducting static timing analysis on a logic design, said logic design including a multi-phase logic clock, circuit logic elements, and connections between said circuit logic elements, wherein said multi-phase logic clock generates a plurality of clock signals, each of said plurality of clock signals alternating between a first level and a second level, each said alternation designated as an edge, and said circuit logic elements include clocked elements for storing and launching data signals, said clocked storage elements being triggered by said plurality of clock signals, said method comprising:

storing periodic timing information for said multi-phase logic clock;

performing a test edge selection utilizing said periodic timing information;

performing a clock adjustment utilizing said periodic timing information by:

defining all ideal activity periods for said multi-phase logic clock;

associating a tag with a data signal launched from said clocked elements, said associated tag including a name of one of said plurality of clock signals, and an edge of one of said plurality of clock signals for explicitly defining an origination of said data signal;

examining a phase of a capturing clock signal and an edge of said capturing clock signal against which an arrival time of said data signal is to be compared;

determining whether a requiring time of said capturing clock signal occurs subsequently to said arrival time of said data signal responsive to said examining step; and performing said clock adjustment responsive to said determining step.

8. The method according to claim 7 wherein said step of performing said clock adjustment responsive to said determining step comprises:

increasing said requiring time of said capturing clock by multiples of a clock cycle if said requiring time of said capturing clock is not greater than said arrival time of said data signal, until said requiring time of said capturing clock is greater than said arrival time of said data signal.

9. A method within a data processing system of performing static timing analysis on a logic circuit that includes a plurality of test points, primary inputs, and a path topology mixture of full cycle and half cycle timing paths, comprising:

establishing a timer model including a plurality of test points each of said plurality of test points including a time record and a phase index;

constructing a phase table in response to said step of establishing a timer model;

asserting primary input arrival times utilizing said established timer model;

propagating phases through said established timer model;

propagating a plurality of input arrival times to each of said plurality of test points in said logic circuit utilizing an initial time specification at said primary inputs of said logic circuit;

computing time delays for said logic circuit; and supplying a valid time record and a valid phase index to each of said plurality of test points within said timer model.

10. The method according to claim 9 wherein said step of establishing a timer model comprises:

establishing a timer model utilizing a logic model of said logic circuit, a set of timing rules for said logic circuit, and a set of assertion data, said assertion data comprising said primary input arrival times and a clock phase definition for each of a plurality of clocks within said logic circuit.

11. An apparatus for performing static timing analysis on a logic circuit that includes a path topology mixture of full cycle and half cycle timing paths, wherein said logic circuit operates in conjunction with a clock signal alternating between a first level and a second level each said alternation designated as an edge, comprising:

means for performing a data event identification event;

means for defining a set of clock-to-data-phase transformation rules in response to said means for performing a data event identification event for defining how a data phase is generated and from what edge of said clock signal said data phase is created for each of a plurality of latching devices within said logic circuit;

means for performing a test edge selection; and means for performing a clock adjustment utilizing said set of clock-to-data-phase transformation rules and said test edge selection.

12. The apparatus according to claim 11 wherein said means for performing a test edge selection comprises:

means for selecting a test edge of said clock signal responsive to which of a rising edge of said clock signal or a falling edge of said clock signal an arrival time of a data signal is to be tested against.

13. The apparatus according to claim 11 wherein said means for performing a clock adjustment comprises:

means for examining said selected test edge associated with a data phase associated with an arriving data signal and said set of clock-to-data-phase transformation rules;

means for deriving a launching edge of said clock signal for said arriving data signal;

means for performing a full cycle clock adjustment if said selected test edge is the same as said derived launching edge of said clock signal for said arriving data signal; and means for performing no clock adjustment if said selected test edge occurs subsequently to said derived launching edge of said clock signal for said arriving data signal.

14. The apparatus according to claim 11 wherein said means for defining a set of clock-to-data-phase transformation rules comprises:

means for defining a set of clock-to-data-phase transformation rules utilizing a trigger sensitivity to an edge of said clock signal of each of said plurality of latching devices within said logic circuit and a phase of said clock signal.

15. The apparatus according to claim 11 wherein said means for performing a data event identification event comprises:

means for defining a first data event initiated by a rising edge of said clock signal; and means for defining a second data event initiated by a falling edge of said clock signal.

16. The apparatus according to claim 15 wherein said means for performing a data event identification event further comprises:

means for establishing a phase of said clock signal utilized by said means for defining a set of clock-to-data-phase transformation rules.

17. A program product to be utilized within a data processing system for performing static timing analysis on a logic circuit including a path topology mixture of full cycle and half cycle timing paths, wherein said logic circuit operates in conjunction with a clock signal alternating between a first level and a second level each said alternation designated as an edge, comprising:

media usable by said data processing system for storing and executing instruction means;

instruction means embodied within said media for performing a data event identification event;

instruction means embodied within said media for defining a set of clock-to-data-phase transformation rules in response to said instruction means for performing a data event identification event for defining how a data phase is generated and from what edge of said clock signal said data phase is created for each of a plurality of latching devices within said logic circuit;

instruction means embodied within said media for performing a test edge selection; and instruction means embodied within said media for performing a clock adjustment utilizing said set of clock-to-data-phase transformation rules and said test edge selection.

18. The program product according to claim 17 wherein said instruction means embodied within said media for performing a test edge selection comprises:

instruction means for selecting a test edge of said clock signal responsive to which of a rising edge of said clock signal or a falling edge of said clock signal an arrival time of a data signal is to be tested against.

19. The program product according to claim 17 wherein said instruction means embodied within said media for performing a clock adjustment comprises:

instruction means for examining said selected test edge associated with a data phase associated with an arriving data signal and said set of clock-to-data-phase transformation rules;

instruction means for deriving a launching edge of said clock signal for said arriving data signal;

instruction means for performing a full cycle clock adjustment if said selected test edge is the same as said derived launching edge of said clock signal for said arriving data signal; and instruction means for performing no clock adjustment if said selected test edge occurs subsequently to said derived launching edge of said clock signal for said arriving data signal.

20. The program product according to claim 17 wherein said instruction means for defining a set of clock-to-data-phase transformation rules comprises:

instruction means for defining a set of clock-to-data-phase transformation rules utilizing a trigger sensitivity to an edge of said clock signal of each of said plurality of latching devices within said logic circuit and a phase of said clock signal.

21. The program product according to claim 17 wherein said instruction means for performing a data event identification event comprises:

instruction means for defining a first data event initiated by a rising edge of said clock signal; and instruction means for defining a second data event initiated by a falling edge of said clock signal.

22. The program product according to claim 21 wherein said instruction means for performing a data event identification event further comprises:

instruction means for establishing a phase of said clock signal utilized by said instruction means for defining a set of clock-to-data-phase transformation rules.

* * * * *

UNITED STATES PATENT AND TRADEMARK OFFICE
CERTIFICATE OF CORRECTION

PATENT NO. : 5,771,375
DATED : June 23, 1998
INVENTOR(S) : Mains

It is certified that error appears in the above-identified patent and that said Letters Patent is hereby corrected as shown below:

Column 5, Line 49: Please change "(+clock_name, RISING_TRIGGERED)" to --(-clock_name, RISING_TRIGGERED)--

Signed and Sealed this

Eighth Day of December, 1998

Attest:

BRUCE LEHMAN

Attesting Officer

Commissioner of Patents and Trademarks